July 29, 1958 M. E. JONES ET AL 2,845,372

GROWN JUNCTION TYPE TRANSISTORS AND METHOD OF MAKING SAME

Filed May 10, 1954

INVENTORS
MORTON E. JONES AND
BY WILLIS A. ADCOCK

Stevens, Davis, Miller and Mosher
ATTORNEYS

United States Patent Office 2,845,372

Patented July 29, 1958

2,845,372

GROWN JUNCTION TYPE TRANSISTORS AND METHOD OF MAKING SAME

Morton E. Jones and Willis A. Adcock, Dallas, Tex., assignors to Texas Instruments Incorporated, Dallas, Tex., a corporation of Delaware Application May 10, 1954, Serial No. 428,472

7 Claims. (Cl. 148—1.5)

This invention relates to grown junction type silicon transistors and to a method for their manufacture. In particular this application relates to a method for growing silicon crystals suitable for use in the manufacture of junction type transistors of the n-p-n type and to a method of making electrical connections to segments taken from such crystals.

Silicon, like germanium, exhibits semiconductor characteristics and it has now been discovered that silicon crystals can be grown in such a manner as to produce an n-type section suitable for use as the collector section of a transistor, a very thin p-type section, and a second n-type section suitable for use as an emitter, and separated from the first n-type section by the p-type section. It has also been discovered that satisfactory electrical connections can be made to each of these three sections in a simple and efficient enough fashion to avoid the production of a large percentage of rejects.

The prior art on the subject of silicon transistors is meager and apparently teaches little or nothing about either the formation of grown crystals for junction transistors or any method of making electrical connections to segments of such crystals after they are formed.

Briefly, according to this invention, the junction containing crystal may be formed in a crystal pulling device which rotates and draws the crystal upon a seed crystal from a bath of molten silicon, in an atmosphere of helium. A small quantity of antimony may be added as an impurity at the beginning of the operation and about half of the crystal then drawn as n-type crystals suitable for use as the collector portion of the final transistor. A quantity of aluminum may then be added to the molten silicon and a thin layer of crystal drawn onto the collector portion. This thin layer is p-type crystal and is usually from 0.1 to 2 mils (0.0001 to 0.002 inch) in thickness. A fairly large quantity of arsenic may next be added to the melt and the remainder of the crystal drawn, and this part of the crystal will be n-type crystal suitable for use as the emitter portion of the eventual transistor.

The crystal so formed may next be cut into segments each about 0.200 inch in length and about 0.040 inch square. Each crystal section is so cut that the ends are of n type crystal and these ends are separated by a thin layer of p-type crystal. The crystal segments may then be etched to reveal the position of the p-type layer, the ends sandblasted and nickel plated so that supporting connections can be soldered thereto, and one or more connections made to the p-type layer by pressing the end of an aluminum wire against the crystal in the plane of the p-type layer and heating the crystal and aluminum wire sufficiently so that the end of the aluminum wire will alloy with and attach itself to the crystal at that point. The junction of the aluminum wire and the crystal may then be etched to remove any direct connection between the aluminum wire and the n-type end portions of the crystal section.

Further details and advantages of this invention will be apparent following detailed description of the preferred embodiment thereof and from the appended drawings illustrative of that embodiment.

In the drawings,

Figure 1*a* is a perspective view of a crystal segment grown and cut in accordance with the preferred practice of this invention. Figure 1*b* is a perspective view of the same crystal segment as it appears after being etched.

Figure 1:
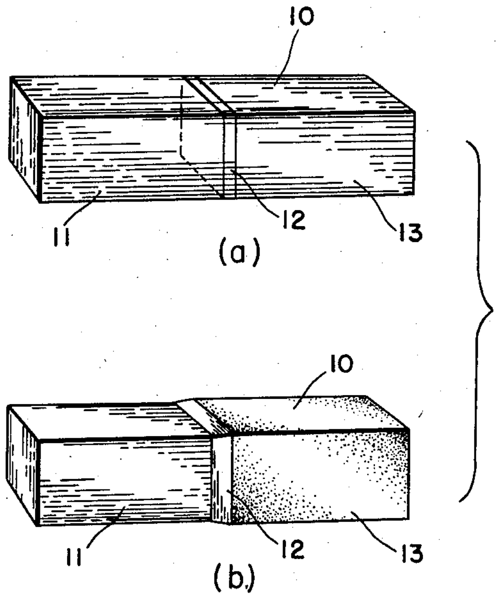

The usual crystal puller, not shown, will conveniently handle about 50 grams of material. It has been found desirable to grow the collector portion of the transistor crystal first and for this portion to have a resistance of about 0.5 to 2.0 ohm centimeters. It has also been found that n-type crystal having this resistance can be produced by incorporating in this portion of the crystal about 0.5 to $2.0\times10^{-7}$ antimony atoms per silicon atom. It is necessary to include about 1.0 to 4.0 milligrams of antimony in the 50 grams of silicon of the melt in order to obtain the proper proportion in the crystal, since the antimony does not crystallize out of the melt in the ratio in which it is present in the melt. To expedite accurate measurement of the antimony for addition to the melt it has been found desirable to prepare a silicon-antimony alloy containing about 0.3 percent antimony, and to add a more easily measurable quantity of the alloy to the melt in an amount sufficient to establish the required percentage of antimony therein.

After about half of the 50 gram melt is converted into crystal, and amount of aluminum sufficient to counteract the effect of the antimony and produce a p-type crystal with a resistivity of about 0.5 to 2.0 ohm centimeters is added to the mass. This requires an excess of about 2 to $8\times10^{-7}$ atoms of aluminum per atom of silicon, over that required to compensate for the antimony present, or a total of about 2.5 to $10\times10^{-7}$ atoms of aluminum per atom of silicon. This amounts to about .0015 to .006 milligram of aluminum for the remaining 25 grams of melt, but since the distribution factor for aluminum is low and only a very small part of the aluminum passes from the melt into the crystal, it requires about 0.75 to 3 milligrams of aluminum in the 25 grams of melt remaining in order to get the required amount of aluminum into the p-layer. The p-layer is then drawn onto the crystal and its thickness is generally kept somewhere between 0.1 and 2 mils (0.0001–0.002 inch).

In order to prepare the mix for the drawing of the emitter portion of the crystal, it is only necessary to add a sufficient amount of arsenic to cause the formation of n-type crystal and lower the resistivity to some very low figure, preferably something of the order of 0.01 ohm centimeter. The amount of arsenic to be added is not critical but arsenic should be present in the final crystal in the ratio of at least about $4\times10^{-5}$ atoms of arsenic per atom of silicon. This means about 5 milligrams of arsenic in 25 grams of crystal, and in order to get this much arsenic in the crystal about 50 milligrams of arsenic should be added to the melt since the arsenic is easily lost and does not all pass into the crystal.

Other elements than antimony may be added to the original mix to prepare it for the drawing of the collector portion of the crystal and those elements of group 5 of the periodic table having satisfactory physical characteristics are suitable for this purpose. However, antimony is preferred since it is desired to accurately control the amount present so as to control the resistivity of the crystal, and antimony lends itself well to this control.

Similarly, other elements of group 3 may be substituted for aluminum in the preparation of the molten mix for the drawing of the p-layer, but aluminum is preferred because it has a low distribution factor and quite a substantial quantity must be added, and therefore the amount can be easily measured.

In the same way, other elements of group 5 may be substituted for arsenic in making the emitter portion of the crystal but arsenic has been found to be more satisfactory.

Once the crystal has been formed it is next cut into segments of the desired size, which are usually about .040 by .040 by .200 inch with the p-layer extending at right angles across the segment near the mid-point of its length. The segments are then etched, preferably with a mixture of hydrofluoric acid, nitric acid, acetic acid and bromine. This causes the emitter portion of the crystal to become glossy and the collector portion of the crystal to remain rough and produces a clear line of demarcation at the p-layer. As illustrated in Figure 1*a*, the crystal section 10 originally has an emitter portion 11, a p-layer 12 and an emitter portion 13. They are not easily distinguishable, however, in the original crystal segment because they have generally the same appearance. However, after etching, as shown in Figure 1*b*, the emitter section 11 appears quite glossy or shiny, the p-layer appears as a definite line and the collector section 13 appears noticeably rough. This is of considerable assistance in locating the p-layer and in determining which end of the crystal segment is which, for final assembly.

The two ends of the crystal section are next roughened, as by sandblasting, in order to help them hold a nickel plating which is then applied. Next, the crystal segment is placed in a helium atmosphere and electrically heated while the end of a 5 mil aluminum wire is pressed against the segment at the p-layer. A microscope may be used to advantage for the purpose of observing the crystal segment and wire during this operation. This heating is continued until the contacting end of the aluminum wire softens and alloys itself with the silicon crystal section, whereupon the heating is stopped and the junction allowed to solidify. It has been found, although the aluminum wire end extends beyond the edges of the p-section and contacts the emitter and collector sections of the crystal segment, that during the heating and solidifying operation enough aluminum mixes with the material of the crystal adjacent portions of the section to convert the part of the crystal section immediately under the end of the wire into p-type crystal. The connection area is again etched after it has cooled, thus removing any material that might possibly connect the aluminum wire directly with either the emitter or collector sections. If a second connection to the p-layer is desired, the crystal section may be turned over and a second aluminum wire connected in the same manner to the p-layer on the opposite side of the crystal section. Thus two aluminum wire connections 14 and 15 may be provided if desired.

Figures 2, 3, 4:
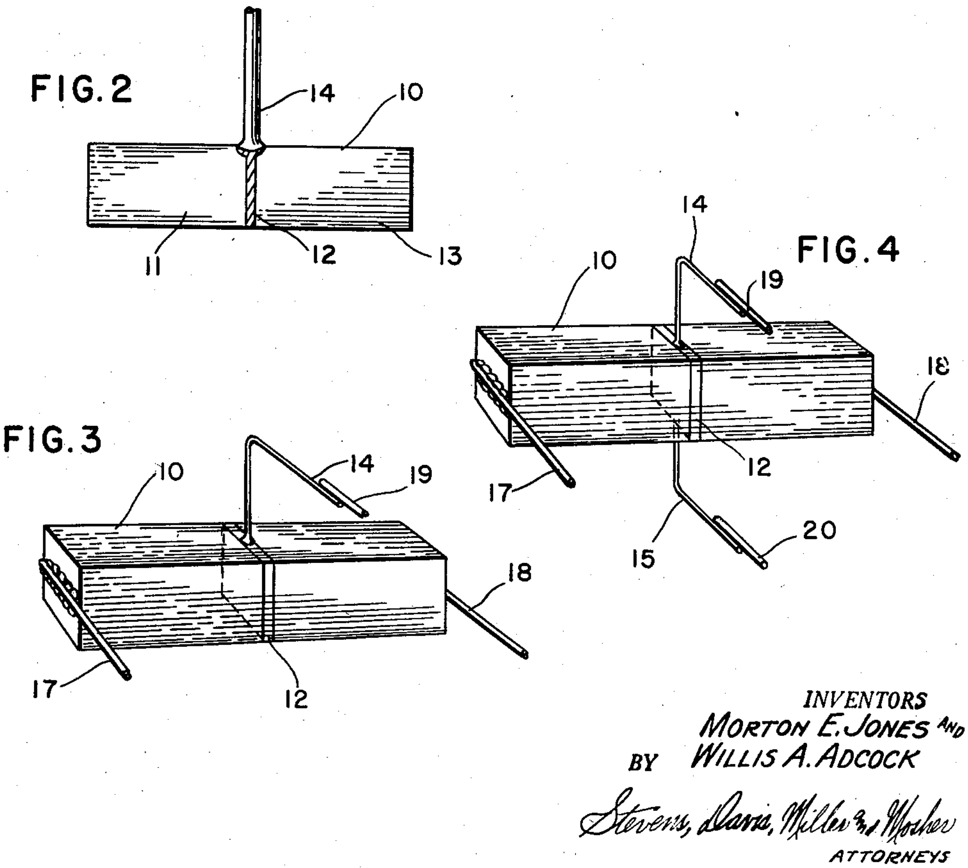
Figure 2 is a sectional view of the same crystal segment with an aluminum wire attached, in accordance with the principles of this invention, to the p-layer of the crystal.
Figure 3 is a perspective view of the same crystal with headers or supporting wires attached to the opposite ends thereof and a single aluminum wire attached to the p-layer.
Figure 4 is a perspective view of a similar crystal with two aluminum wire terminals attached to the p-layer.

Supporting and connecting wires 17 and 18 may be soldered to the plated ends of the crystal section, as illustrated in Figures 3 and 4 and these are in turn connected to a base, not shown. The aluminum wires 14 and 15, which are quite fine, are connected to somewhat heavier wires 19 and 20 which are also mounted in the base of the unit.

The transistor, of course, may be used in the form shown but customarily it will be encased in an inert, heat conducting liquid and covered with a can or cover of some kind.

Numerous modifications in the details of this invention will immediately be apparent to those skilled in the art and are intended to be included within the scope of this description and within the definition of the appended claims.

What is claimed is:

1. A grown crystal junction transistor, that comprises an n-p-n silicon crystal segment, the collector section of which contains about 0.5 to $2.0 \times 10^{-7}$ antimony atoms per silicon atom, the base layer of which contains about the same proportion of antimony atoms plus about 2.5 to $10 \times 10^{-7}$ atoms of aluminum per atom of silicon, and the emitter section of which contains about the same proportions of antimony and aluminum plus at least about $4 \times 10^{-5}$ atoms of arsenic per atom of silicon.

2. A transistor as defined in claim 1 in which the first mentioned n-section and the p-section have a resistivity of about 0.5 to 2.0 ohm centimeters, and the last mentioned n-section has a resistivity no greater than about 0.01 ohm centimeter.

3. A transistor as defined in claim 1 in which connection to the p-layer is made by means of an aluminum wire, an end of which is alloyed into the surface of the crystal segment at the p-layer.

4. A transistor as defined in claim 1 in which two connections to the p-layer are made by means of two aluminum wires, an end of each of which is alloyed into the surface of the crystal segment, at separated points, at the p-layer.

5. A method of growing a crystal for a junction transistor that comprises melting a batch of silicon containing about 1.0 to 4.0 milligrams of antimony to 50 grams of silicon, drawing upon a seed crystal an n-type crystal section, adding to the molten silicon that remains a sufficient amount of aluminum to give a concentration of about 0.75 to 3 milligrams of aluminum to 25 grams of silicon, drawing a very thin layer of p-type crystal from the melt upon the n-type crystal already formed, adding an amount of arsenic to the melt sufficient to give an arsenic concentration in the melt of at least about 50 milligrams of arsenic to 25 grams of silicon and drawing upon the already formed crystal a second layer of n-type crystal.

6. A method of forming a transistor as defined in claim 5 in which the drawn crystal is cut into segments each containing a p-type layer and in which an aluminum contact wire is fastened to the p-type layer by bringing an end thereof into contact with the p-type layer and heating the crystal segment and aluminum until the aluminum wire alloys with and fastens itself to the crystal segment.

7. A method of forming a transistor as defined in claim 5 in which the drawn crystal is cut into segments each containing a p-type layer and in which two aluminum wires are fastened to the p-type layer by bringing an end of each thereof into contact with the p-type layer, at separated points, and heating the crystal segment and aluminum until the aluminum wires alloy with and fasten themselves to the crystal segment.

References Cited in the file of this patent

UNITED STATES PATENTS

| | | |
|---|---|---|
| 2,623,102 | Shockley | Dec. 23, 1952 |
| 2,631,356 | Sparks | Mar. 17, 1953 |
| 2,654,059 | Shockley | Sept. 29, 1953 |
| 2,705,767 | Hall | Apr. 5, 1955 |
| 2,736,822 | Dunlap | Feb. 28, 1956 |

FOREIGN PATENTS

| | | |
|---|---|---|
| 503,719 | Belgium | June 30, 1951 |